United States Patent [19]
Grudkowski et al.

[11] Patent Number: 5,264,717
[45] Date of Patent: Nov. 23, 1993

[54] HACT STRUCTURE WITH REDUCED SURFACE STATE EFFECTS

[75] Inventors: Thomas W. Grudkowski; Robert N. Sacks, both of Glastonbury, Conn.

[73] Assignee: United Technologies Corporation, Hartford, Conn.

[21] Appl. No.: 894,141

[22] Filed: Jun. 4, 1992

[51] Int. Cl.$^5$ ............... H01L 29/161; H01L 29/205; H01L 29/84; H01L 29/96

[52] U.S. Cl. .................... 257/245; 257/183.1; 257/416; 257/14; 257/24; 333/150

[58] Field of Search ............. 257/218, 416, 183, 241, 257/245, 222, 15; 333/150, 416

[56] References Cited

U.S. PATENT DOCUMENTS 4,893,161  1/1990  Tanski et al. ............... 257/245
5,191,400  3/1993  Miller ........................ 257/245

Primary Examiner—Jerome Jackson
Assistant Examiner—John F. Guay
Attorney, Agent, or Firm—Gerald L. DePardo

[57] ABSTRACT

A heterojunction acoustic charge transport (HACT) device having a charge transport layer 16 surrounded by upper and lower charge confinement layers 14,30, respectively, and having a cap layer 36 at the outer surface, above the upper confinement layer 30, is provided with a P-N junction to minimize the effects of surface states. An intermediate layer 34 is disposed between the cap layer 36 and upper charge confinement layer 30. The upper confinement layer 30 and intermediate layer 34 are doped with opposite polarities to provide a P-N junction which creates a built-in electric field having sufficient strength to keep mobile charge carriers, transported by a SAW along the charge transport channel, from being trapped by or recombined with surface states at the external interface of the cap layer 36. Alternatively, the intermediate layer is not present and a cap layer 42 is doped to provide one side of the P-N junction.

9 Claims, 4 Drawing Sheets

5,264,717

HACT STRUCTURE WITH REDUCED SURFACE STATE EFFECTS

TECHNICAL FIELD

This invention relates to heterojunction acoustic charge transport (HACT) devices, and more particularly, to HACT devices having mobile charge carriers near an exterior surface of the device.

BACKGROUND ART

It is known in the art to create a heterojunction acoustic charge transport device (HACT) having a plurality of layers typically comprising a charge transport layer surrounded on its upper and lower surfaces by charge confinement layers. Above the upper charge confinement layer (at the external air interface), is typically a cap layer. All of the aforementioned layers may be grown above a substrate, such as gallium arsenide (GaAs). The lower charge confinement layer is typically made of undoped (or not intentionally doped) aluminum gallium arsenide (AlGaAs), and the upper charge confinement layer is typically made of N-doped AlGaAs (i.e., AlGaAs doped with an N-type dopant). The charge transport layer is typically made of undoped GaAs. However, other semiconductors having piezoelectric properties known to those skilled in the art may also be substituted for these materials. It is also known that a surface acoustic wave (SAW) may be launched into the HACT structure by known means, such as an interdigital SAW transducer. Further, charge may be injected into the structure at one end and be carried by the SAW (in groups called "charge packets") along the charge transport layer to another where it is removed. The charge carried by the SAW stays confined to the charge transport layer because the charge transport layer material has a conduction band energy lower than that of the surrounding charge confinement layers. Such a HACT device is described in commonly-owned U.S. Pat. No. 4,893,161 to Tanski et al, which is incorporated herein by reference.

It is also known in the art that HACT epitaxial layer structures have "surface states" at the air/cap layer interface (i.e., the external surface of the cap layer). Surface states are a well known phenomena which exhibit trapping and recombination sites for mobile charge carriers. It is speculated by those skilled in the art that surface states are created due to imperfections (defects) in the crystalline structure at the external surface of the device which cause loose molecular bonds. However, it is known that surface states "trap" (attract and hold) electrons from, or supply electrons to "recombine" with, the charge packets propagating within the charge transport layer, thereby distorting the information carried thereby.

Prior attempts to reduce the effects of the surface states have included an N-doped GaAs cap layer, whereby the dopant electrons are intended to fill the surface states so that electrons transported by the SAW do not get trapped by the surface states. The precise doping concentration for satisfying surface state traps depends on the number of traps at the surface, which can vary depending upon material processing. However, even if all the traps are satisfied by donor electrons, the surface states will still cause carrier recombinations because the bonds to the surface states are not strong. Similarly, running an initial group of charge packets through the system at power-up in an attempt to fill the surface states suffers the same results (i.e., electrons would be attracted to the surface states and subsequently leave the surface states and recombine with the charge packets).

Therefore, it is desirable to reduce the effects of surface states in a predictable and reproducible manner in order to improve the charge transport efficiency along the charge transport layer.

DISCLOSURE OF INVENTION

Objects of the invention include provision of a heterojunction acoustic charge transport (HACT) device which has improved charge transport efficiency along a charge transport channel by reducing effects of surface states in a reproducible manner.

According to a first aspect of the present invention, a HACT device comprises a charge transport layer (or channel) surrounded by an upper and a lower charge confinement layer, an intermediate layer above the upper confinement layer, and a cap layer above the intermediate layer, which forms an outer surface of the device. A P-N junction is employed comprising the upper confinement layer doped with a first dopant polarity and the intermediate layer doped with a second dopant polarity opposite to the first dopant polarity. The P-N junction provides a built-in electric field having sufficient strength to keep mobile charge carriers, which are transported by a SAW along the charge transport channel, from being trapped by or recombined with surface states at the air interface (external surface) of the cap layer.

According further to the first aspect of the invention, the lower confinement layer is made of AlGaAs, the charge transport layer is made of GaAs, and the upper charge confinement layer is made of AlGaAs. According further still to the first aspect of the invention, the cap layer is made of GaAs. In still further accord to the first aspect of the invention, the intermediate layer is made of AlGaAs. According still further to the first aspect of the invention, the mobile charge carriers are electrons, the upper charge confinement layer is doped with an N-type dopant, and the intermediate layer is doped with a P-type dopant.

According to a second aspect of the present invention, a HACT device comprises a charge transport layer surrounded by an upper and a lower charge confinement layer, and a cap layer above the upper confinement layer, which forms an outer surface of the device. A P-N junction is employed by having the upper confinement layer doped with a first dopant polarity and by having the cap layer doped with a second dopant polarity opposite to the first dopant polarity. The P-N junction provides a built-in electric field having sufficient strength to keep mobile charge carriers, which are transported by a SAW along the charge transport layer, from being trapped by or recombined with surface states at the air interface (external surface) of the cap layer.

According further to the second aspect of the invention, the lower confinement layer is made of AlGaAs, the charge transport layer is made of GaAs, and the upper charge confinement layer is made of AlGaAs. According further still to the second aspect of the invention, the cap layer is made of GaAs. According still further to the second aspect of the invention the mobile charge carriers are electrons, upper charge confinement layer is doped with an N-type dopant, and the cap layer is doped with a P-type dopant.

The invention represents a significant improvement over previous HACT devices by inhibiting disruption of charge packets carried by the SAW along the charge transport channel caused by the surface states. Furthermore, this technique may be used with mobile charge carriers of either electrons or holes.

The foregoing and other objects, features and advantages of the present invention will become apparent in light of the following detailed exemplary embodiments thereof, as illustrated in the accompanying drawings.

BEST MODE FOR CARRYING OUT THE INVENTION

Figure 1:
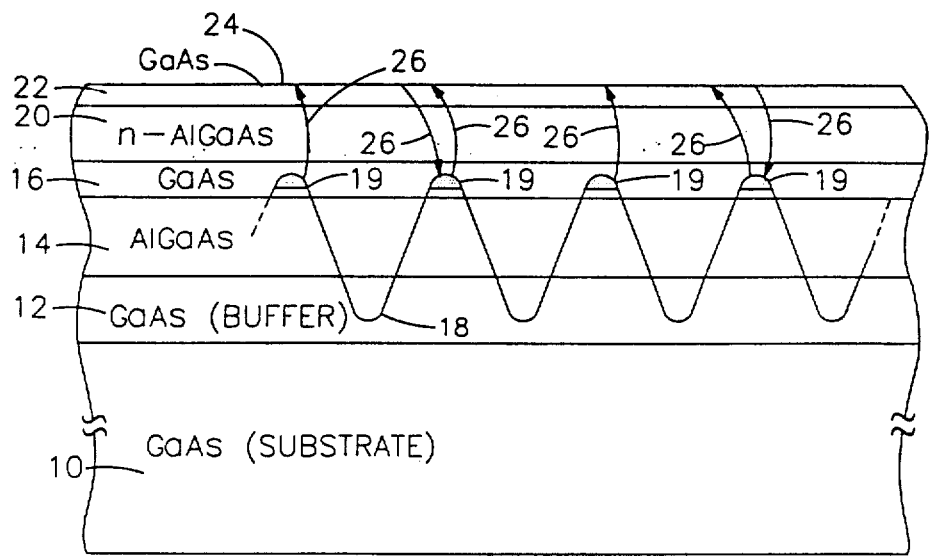
FIG. 1 is a cross sectional view of the layer of a prior art HACT device.

Referring to FIG. 1, a typical prior art HACT device similar to that described in the aforementioned U.S. Pat. No. 4,893,161, comprises a substrate 10 made of GaAs having a thickness of approximately 500 microns. Grown above the substrate 10 is a buffer layer 12 of GaAs having a thickness of approximately 1000 to 9000 Å, which is grown, as is known, to provide clean GaAs material to grow the remaining layers from. Grown above the buffer layer 2 is a lower charge confinement layer 14 made of AlGaAs having a 32% concentration of aluminum (Al) not intentionally doped (NID) and having a thickness of approximately 1100 Å. Above the lower charge confinement layer 14, is a charge transport layer 16 made of NID GaAs, having a thickness of approximately 400 Å. The charge transport layer 16 is also called a charge transport channel because the layer 16 acts as a conduit (or channel) for propagating electrons without having electrons leak into other layers of the device (due to the difference in conduction band energy, as discussed hereinbefore).

A surface acoustic wave (SAW) 18 is launched and propagates through the HACT device, as disclosed hereinbefore, and carries charge packets 19 (a group of electrons) along the charge transport 16. Above the charge transport layer 16 is an upper charge confinement layer 20 made of AlGaAs having an Al concentration of 32% and being N-doped with a concentration of approximately $2 \times 10^{17}/cm^3$ and having a thickness of approximately 700 Å. Above the upper charge confinement layer 20, is a cap layer 22 made of NID GaAs having a thickness of approximately 200 Å.

The outer surface 24 of the cap layer 22 of the prior art HACT device exhibits surface states, as described hereinbefore, which attract or recombine with (as shown by lines 26) electrons travelling along the SAW 18 through the charge transport layer 16. The surface states may be caused by dangling bonds, dislocations in the crystal, vacancies within the crystal, or by other reasons, and exist at the surface 22 or within an atomic layer thereof. As the SAW 18 propagates along the charge transport channel 16, electrons in the charge packets 19 are attracted to or are recombined with charges from the surface states, thereby altering the amount of charge in the charge packets and disrupting the transportation of electronic information along the channel (as discussed hereinbefore).

Figure 2:
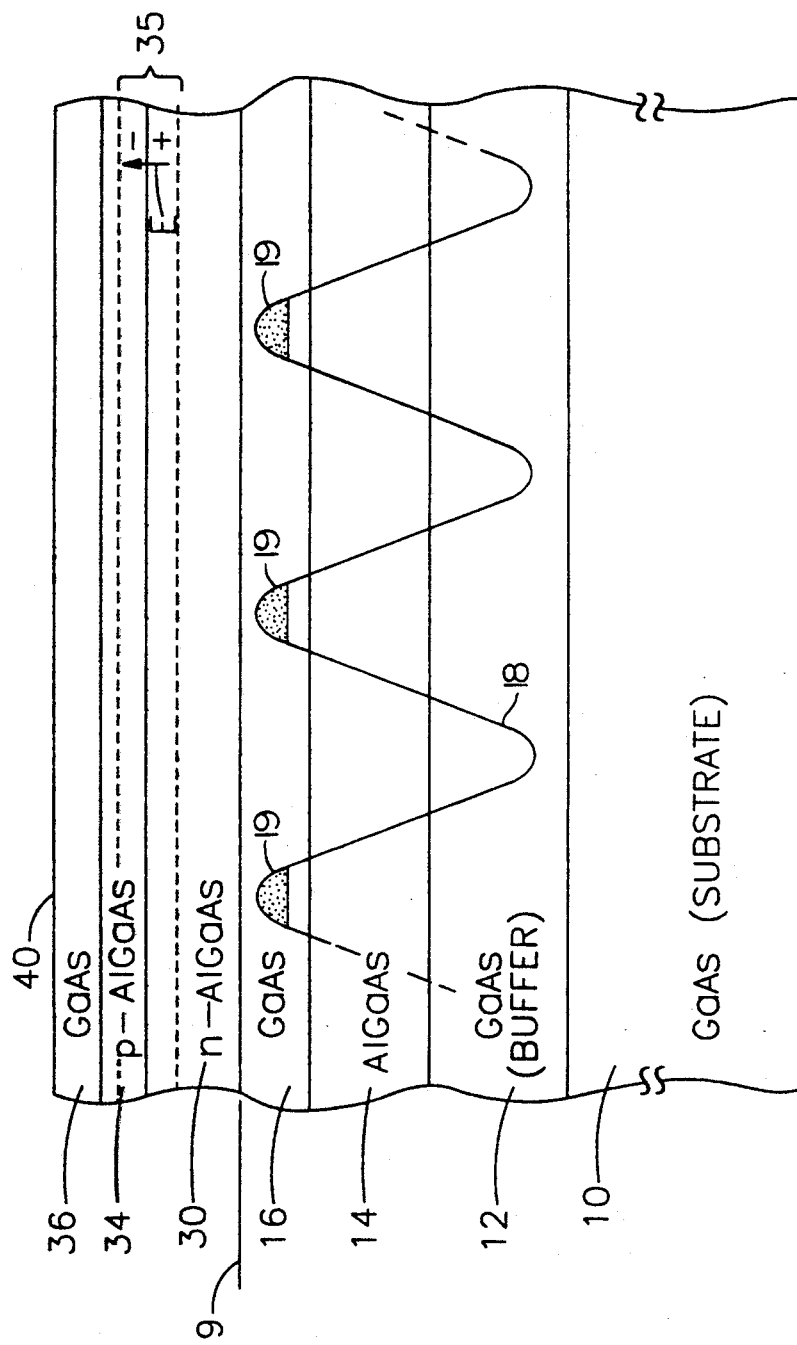
FIG. 2 is a cross sectional view of the layers of a HACT device having an upper confinement layer comprising N-doped AlGaAs, an intermediate layer comprising P-doped AlGaAs, and a cap layer comprising GaAs in accordance with a first aspect of the present invention.

Referring now to FIG. 2, layers below the line 9 represent the prior art. Above the charge transport layer 16, is an upper charge confinement layer 30 of N-doped AlGaAs having a concentration of Al of $2 \times 10^{17}/cm^3$ and a thickness of approximately 700 Å, similar to that of the prior art. Above the upper charge confinement layer 30, is an intermediate layer 34 of P-doped AlGaAs having a dopant concentration of approximately $10^{17}$ to $10^{18}/cm^3$ and a thickness of about 50 to 100 Å. Above the layer 34 is a cap layer 36 of NID GaAs having a thickness of 50 to 100 Å.

The layers 30,34 comprise a P-N junction thereby creating a depletion region 35 having an inherent electric field E (or potential voltage barrier) which repels mobile electrons travelling along the SAW in the charge packets 19 within the charge transport channel 16. The concentration of the P-dopant in the intermediate layer 34 is chosen to be high enough to form a suitable potential barrier to overcome the attraction from the surface states discussed hereinbefore. However, the dopant concentration must not be so high as to short-out the SAW surface potential.

The higher the P-doping concentration of the layer 34, the greater the built-in field E, the greater the electron repulsion, and the thinner the layer 34 needs to be. Conversely, the reverse is true for lower doping levels. Furthermore, the depletion region 35 must be designed so as not to extend into the charge transport layer 16. Also, as is known, the charge transport layer 16 should be kept as close to the surface 40 as possible, e.g., 0.01 to 0.1 times the SAW wavelength, to maximize the time response of charge sensing electrodes (not shown) typically mounted on the surface 40.

The N-type dopant for AlGaAs may be silicon (Si) and the P-type dopant for AlGaAs may be beryllium (Be) or carbon (C). However, other dopants may be used depending on the type of growing technique used. The deposition (growth) technique for the invention is molecular beam epitaxy, where the vapor pressure and the sticking coefficient of the dopant material are important parameters in selecting a dopant. However, other techniques may be used if desired, as is known. Dopants used with other growth techniques include sulfur (S) for an N-type dopant and zinc (Zn) for a P-type dopant.

It should be understood by those skilled in the art of P-N junctions and heterojunctions that other doping concentrations and thickness ranges of the P-doped layer 34 which satisfy the conditions of electron repulsion, depletion layer thickness, and electric field strengths which do not short out the SAW fields at the surface 40, may be used.

With the P-N junction in place, the cap layer 36 still exhibits surface states of the upper surface 40; however, they are no longer satisfied by mobile charge carriers from the charges carried along the charge transport layer due to the electric field E.

Figure 3:
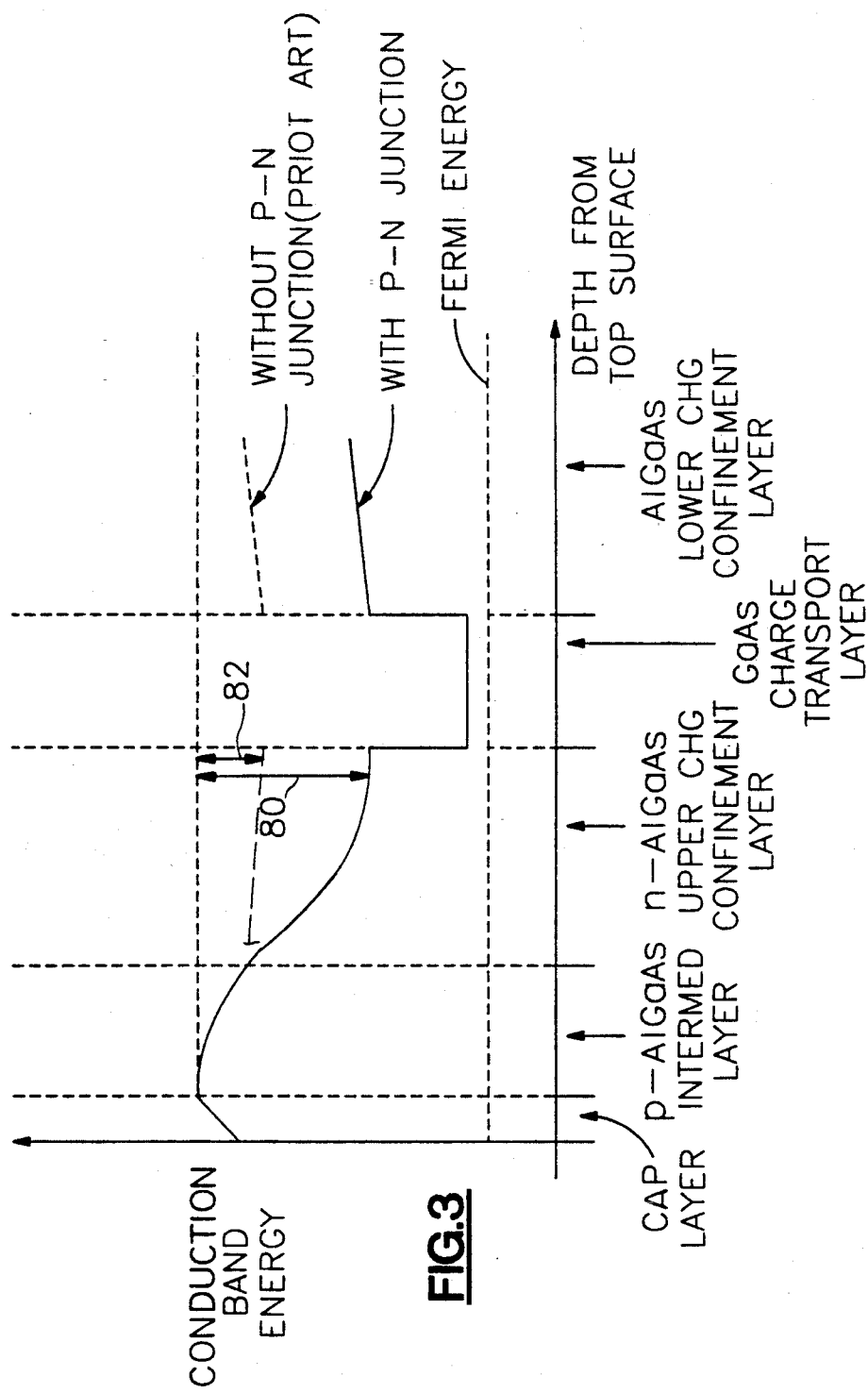
FIG. 3 is a graph of the conduction band energy level versus the depth into the HACT device showing the built-in potential voltage barrier generated by the P-N junction in accordance with the present invention as compared against the prior art.
Figure 4:
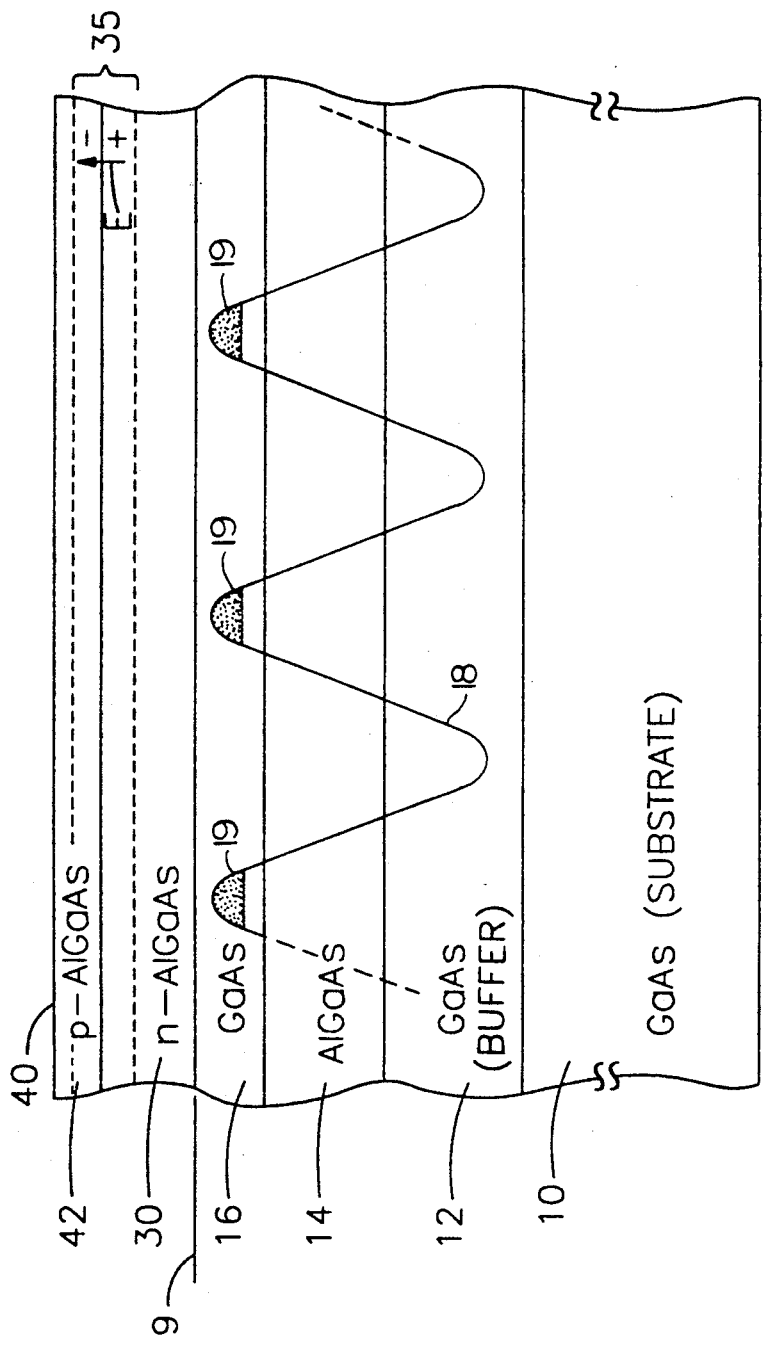

Referring to FIG. 3, a graph of the conduction band energy level shows the built-in electric field 80 (potential barrier or potential difference) due to the P-N junction of the invention as compared with the potential barrier 82 without the P-N junction. The potential barrier 80 between the cap layer 36 and just prior to the quantum well of the charge transport layer is much larger than the potential barrier 82 of the prior art, thereby providing a sufficient repelling electric field E (FIG. 2) to allow charge packets to propagate along the charge transport channel undisturbed by the surface states at the surface 40 of the cap layer 36.

Although the invention has been described as using electrons as the mobile charge carriers making up the charge packets 19, it should be understood by those skilled in the art that holes may be used instead of, or in addition to, electrons. In that case, the upper confinement layer 30 would be P-doped and intermediate layer 34 would be N-doped, so as to direct the electric field E in the opposite direction to that shown in FIG. 2.

Also, instead of having an NID cap layer, the cap layer may be doped with the same polarity as the intermediate layer 34.

Further, although the intermediate layer is shown as being made of the same material as the upper charge confinement layer 30 (i.e., AlGaAs), it should be understood that the intermediate layer may instead be made of the same material of the cap layer (i.e., a material that properly interfaces with the given HACT device design).

Figure 4:
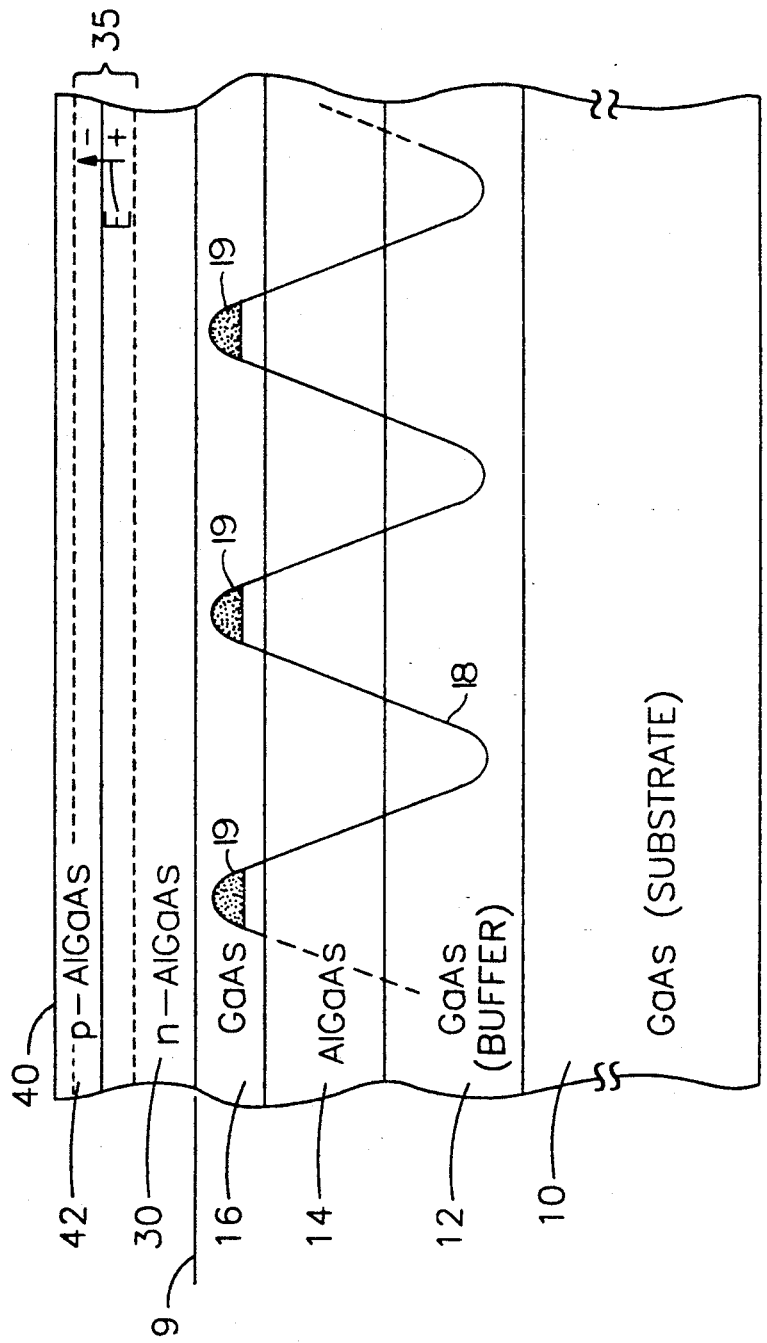
FIG. 4 is a cross sectional view of the layers of a HACT having an upper confinement layer comprising N-doped AlGaAs and a cap layer comprising P-doped GaAs, in accordance with a second aspect of the present invention.

Referring now to FIG. 4, the invention will work equally well in an alternative embodiment having a P-doped GaAs cap layer 42 and not having the intermediate layer 34 (FIG. 2). In that case, the P-doped cap layer 42 is the layer directly above the upper charge confinement layer 30, and has the same thickness as described hereinbefore for the cap layer 36 (FIG. 2) and the same dopant concentration as described hereinbefore for the intermediate layer 34 (FIG. 2).

Furthermore, the charge injection electrodes, nondestructive electrode taps for monitoring charges, and charge extraction electrodes, such as those described in the aforementioned Tanski et al patent are unaffected by the present invention.

Still further, instead of using the GaAs and AlGaAs as the substrate and charge transport layers, respectively, it should be understood that the invention will work equally well with any HACT design, i.e., piezoelectric semiconductor substrate and semiconductor (or piezoelectric semiconductor) charge transport layer, charge confinement layers, and cap layer, provided a P-N junction is employed between the charge transport layer and the surface states.

For example, the charge transport layer could be made of InGaAs as long as the concentration is not so high as to cause excessive lattice mismatches, as is known. Alternatively, the substrate could be made of Indium Phosphide (InP) with the charge confinement layers made of $In_xAl_{1-x}As$ (with $x=0.52$), with the upper charge confinement layer being N-doped, and the charge transport layer made of $In_xGa_{1-x}As$ (with $x=0.53$).

Although the invention has been described and illustrated with respect to exemplary embodiments thereof, it should be understood by those skilled in the art that the foregoing and various other changes, omissions and additions may be made without departing from the spirit and scope of the invention.

We claim:

1. A heterojunction acoustic charge transport device having a SAW propagating therein and having charge packets being carried by the SAW, comprising:
   a piezoelectric semiconductor substrate;
   a lower charge confinement layer of semiconductor material disposed above said substrate;
   a charge transport layer of semiconductor material disposed above and contiguous with said lower charge confinement layer;
   an upper charge confinement layer of semiconductor material disposed above and contiguous with said charge transport layer having a first dopant polarity for a P-N junction;
   said upper and lower charge confinement layers having a higher conduction band potential than said charge transport layer for confining said charge packets to said charge transport channel;
   an intermediate layer of semiconductor material disposed above and contiguous with said upper charge confinement layer having a second dopant polarity for said P-N junction;
   a cap layer disposed above said upper charge confinement layer and having surface states substantially at an external surface thereof, said surface states being capable of altering the amount of charge carried by the charge packets; and
   said upper charge confinement layer and said intermediate layer together forming said P-N junction to inhibit said surface states from altering the amount of charge carried by the charge packets, and having a depletion region extending within both said upper charge confinement layer and said intermediate layer.

2. The heterojunction acoustic charge transport device according to claim 1, wherein said substrate comprises GaAs, said lower charge confinement layer comprises AlGaAs, said charge transport layer comprises GaAs, and said upper charge confinement layer comprises AlGaAs.

3. The heterojunction acoustic charge transport device according to claim 1, wherein said cap layer comprises GaAs.

4. The heterojunction acoustic charge transport device according to claim 1, wherein said intermediate layer comprises AlGaAs.

5. The heterojunction acoustic charge transport device according to claim 1, wherein said charge packets carry electrons, said intermediate layer is doped with a P-type dopant, and said upper charge confinement layer is doped with an N-type dopant.

6. A heterojunction acoustic charge transport device having a SAW propagating therein and having charge packets being carried by the SAW, comprising:
   a piezoelectric semiconductor substrate;
   a lower charge confinement layer of semiconductor material disposed above said substrate;
   a charge transport layer of semiconductor material disposed above and contiguous with said lower charge confinement layer;
   an upper charge confinement layer of semiconductor material disposed above and contiguous with said charge transport layer having a first dopant polarity for a P-N junction;
   said upper and lower charge confinement layers having a higher conduction band potential than said charge transport layer for confining said charge packets to said charge transport channel;

a cap layer disposed above and contiguous with said upper charge confinement layer, having surface states substantially at an external surface thereof, said surface states being capable of altering the amount of charge carried by the charge packets, and having a second dopant polarity, opposite said first dopant polarity, for said P-N junction; and said upper charge confinement layer and said cap layer together forming said P-N junction to inhibit said surface states from altering the amount of charge carried by the charge packets, and having a depletion region extending within both said upper charge confinement layer and said cap layer.

7. The heterojunction acoustic charge transport device according to claim 6, wherein said substrate comprises GaAs, said lower charge confinement layer comprises AlGaAs, said charge transport layer comprises GaAs, and said upper charge confinement layer comprises AlGaAs.

8. The heterojunction acoustic charge transport device according to claim 6, wherein said cap layer comprises GaAs.

9. The heterojunction acoustic charge transport device according to claim 6, wherein said charge packets carry electrons, said cap layer is doped with a P-type dopant, and said upper charge confinement layer is doped with an N-type dopant.

* * * * *

UNITED STATES PATENT AND TRADEMARK OFFICE
CERTIFICATE OF CORRECTION

PATENT NO. : 5,264,717

DATED : November 23, 1993

INVENTOR(S) : Thomas W. Grudkowski, et al

Page 1 of 2

It is certified that error appears in the above-indentified patent and that said Letters Patent is hereby corrected as shown below:

The drawing sheet consisting of Figure 4, should be deleted and replaced with Figure 1, as shown on the attached page.

Signed and Sealed this

Twenty-fourth Day of May, 1994

Attest:

BRUCE LEHMAN

Attesting Officer

Commissioner of Patents and Trademarks